United States Patent
Celii et al.

(10) Patent No.: US 6,841,396 B2
(45) Date of Patent: Jan. 11, 2005

(54) VIA0 ETCH PROCESS FOR FRAM INTEGRATION

(75) Inventors: Francis Gabriel Celii, Dallas, TX (US); K. R. Udayakumar, Dallas, TX (US); Scott R. Summerfelt, Garland, TX (US); Theodore S. Moise, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/440,697

(22) Filed: May 19, 2003

(65) Prior Publication Data

US 2004/0235259 A1 Nov. 25, 2004

(51) Int. Cl.[7] ...................... H01L 21/00; H01L 21/8242
(52) U.S. Cl. ..................... 438/3; 438/239; 438/240; 438/250; 438/253; 438/396; 438/238
(58) Field of Search ................... 438/3, 238, 239, 438/240, 241, 250, 253, 381, 393, 396, 706, 736, 738; 257/295, 306, 310

(56) References Cited

U.S. PATENT DOCUMENTS

| | | | |
|---|---|---|---|
| 6,144,060 A | 11/2000 | Park et al. | |
| 6,211,035 B1 | 4/2001 | Moise et al. | |
| 6,225,656 B1 | 5/2001 | Cuchiaro et al. | |
| 6,249,014 B1 * | 6/2001 | Bailey | 257/295 |
| 6,261,967 B1 | 7/2001 | Athavale et al. | |
| 6,284,654 B1 | 9/2001 | Roeder et al. | |
| 6,316,797 B1 | 11/2001 | Van Buskirk et al. | |
| 6,320,213 B1 | 11/2001 | Kirlin et al. | |
| 6,444,542 B2 | 9/2002 | Moise et al. | |
| 6,485,988 B2 * | 11/2002 | Ma et al. | 438/3 |
| 6,492,222 B1 * | 12/2002 | Xing | 438/240 |
| 6,534,809 B2 * | 3/2003 | Moise et al. | 257/295 |
| 6,548,343 B1 | 4/2003 | Summerfelt et al. | |
| 2001/0034106 A1 | 10/2001 | Moise et al. | |
| 2001/0044205 A1 | 11/2001 | Gilbert et al. | |

OTHER PUBLICATIONS

"FeRAM Tutorial", Ali Sheikholeslami and P. Glenn Gulak, A survey of circuit innovations in Ferroelectric random–access memories, Proceedings of the IEEE, vol. 88, No. 3, May, 2000, 3 pages, taken from the Internet at: http://www.eecg.toronto.edu/–ali/ferro/tutorial.html.

"A Survey of Circuit Innovations in Ferroelectric Random Access Memories", Ali Sheikholeslami and P. Glenn Gulak, Proceedings of the IEEE, vol. 88, No. 5, May, 2000, pp. 667–689.

"Generic CVD Reactor", CVD Basics, Daniel M. Dobkin, Dec. 7, 2001, 3 pages, taken from the Internet at: http://www.batnet.com/enigmatics/semiconductor_processing/CVD_Fundamentals/Introd . . . .

"Physical Vapor Deposition", Cougar Labs, Inc., Dec. 7, 2001, 9 pages, taken from the internet at: http://www.cougarlabs.com/pvd1.html.

* cited by examiner

Primary Examiner—Maria F. Guerrero
(74) Attorney, Agent, or Firm—Jacqueline J. Garner; W. James Brady, III; Frederick J. Telecky, Jr.

(57) ABSTRACT

A ferroelectric memory device comprises a logic programmable capacitance reference circuit. The circuit is adapted to generate a reference voltage during a sense mode of operation, wherein the reference voltage comprises a value that is a function of one more memory conditions. The memory device further comprises a bit line pair, wherein a first bit line of the bit line pair has a ferroelectric capacitor coupled thereof for sensing thereof, and a second bit line of the bit line pair is coupled to the reference voltage. A sense circuit is coupled to the bit line pair and is configured to detect a data state associated with the ferroelectric capacitor using a voltage associated with the first bit line and reference voltage on the second bit line.

21 Claims, 12 Drawing Sheets

VIA0 ETCH PROCESS FOR FRAM INTEGRATION

FIELD OF INVENTION

The present invention relates generally to semiconductor devices, and more particularly to a method of performing a contact etch in conjunction with the fabrication of ferroelectric capacitors in a semiconductor manufacturing process.

BACKGROUND OF THE INVENTION

Ferroelectric random access memory (FRAM) devices, and other type semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) configurations, in which data is read from or written to the device using address signals and various other control signals. The individual memory cells typically comprise one or more ferroelectric (FE) capacitors adapted to store a binary data bit, as well as one or more access transistors, typically MOS devices, operable to selectively connect the FE capacitor to one of a pair of complimentary bit lines, with the other bit line being connected to a reference voltage. The individual cells are commonly organized as individual bits of a corresponding data word, wherein the cells of a given word are accessed concurrently through activation of plate lines and word lines by address decoding circuitry.

FRAM devices provide non-volatile data storage where data memory cells include capacitors constructed with ferroelectric dielectric material that may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an electric field to the ferroelectric capacitor in excess of the coercive field of the material. Conversely, reversal of the applied field reverses the internal dipoles. The response of the polarization of a ferroelectric capacitor to the applied voltage may be plotted as a hysteresis curve.

As illustrated in prior art FIG. 1, a 1T/1C FRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL)(e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bit line1 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently the sense amplifier reference voltage is a ferroelectric or non-ferroelectric capacitor connected to another bit line that is not being read. In this manner, the memory cell data is retrieved.

A characteristic of the shown ferroelectric memory cell is that a read operation is destructive. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. The one difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bit line-bar line 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bit line-bar line 34, respectively. A differential signal (not shown) is thus generated across the bit line 32 and the bit line-bar line 34 by the dual capacitor memory cell 30. The differential signal is sensed by a sense amplifier (not shown) that provides a signal corresponding to the logic level stored in memory.

When integrating the fabrication of ferroelectric capacitors with standard CMOS, for example, several challenges exist. One challenge is that the ferroelectric film employed in the ferroelectric capacitor is often susceptible to degradation due to hydrogen contamination. Since many back end processes (ILD formations, metallizations, etc.) employ hydrogen, the ferroelectric capacitor typically employs a hydrogen diffusion barrier that substantially surrounds the capacitor to mitigate the deleterious effects of hydrogen contamination. Fabrication processing employing such a barrier has various challenges associated therewith.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a method of forming a ferroelectric capacitor and an electrical contact down to a top portion thereof. The electrical contact opening is formed by etching, wherein a multi-step etch process is performed in a single etch tool, thereby improving process throughput. In addition, the etch process results in improved contact quality by reducing an amount of via "fluting" associated with prior art processing.

In accordance with one aspect of the present invention, a method of forming a ferroelectric capacitor comprises forming a ferroelectric capacitor stack over a substrate or semiconductor body, wherein the stack comprises a top and bottom electrode with a ferroelectric dielectric material disposed therebetween. A sidewall diffusion barrier layer is formed over the ferroelectric capacitor stack followed by a dielectric material. A contact via is then formed through the dielectric material and the sidewall diffusion barrier layer down to a top portion of the capacitor stack, wherein the via is formed through the layers in a single etch tool.

In accordance with another aspect of the present invention, an etch stop layer is formed over the sidewall diffusion barrier layer prior to the formation of the dielectric material over the capacitor stack. The contact via etch process hen comprises a multi-step process, wherein the patterning of the dielectric layer, the etch stop layer and the sidewall diffusion barrier layer down to the top of the capacitor stack is performed within a single etch tool.

According to still another aspect of the present invention, the sidewall diffusion barrier layer comprises an aluminum oxide, the etch stop layer comprises a silicon nitride, and the dielectric material contains silicon oxide. The multi-step etch process comprises patterning the dielectric material with a fluorocarbon-oxygen chemistry, the silicon nitride is patterned with a $CH_2F_2/O_2$ type chemistry, and the aluminum oxide is etched with a fluorocarbon-oxygen based etch chemistry similar to that employed to pattern the dielectric. The multi-step etch process to form the via is performed in a single etch tool, thereby improving the process throughput. Further, use of the fluorocarbon-oxygen etch for the aluminum oxide advantageously reduces contact fluting, thereby improving the quality of the contact and thus increasing resultant device yield.

In accordance with yet another aspect of the present invention, the capacitor stack is formed over a bottom electrode diffusion barrier and the bottom electrode diffusion barrier is patterned prior to the deposition of the sidewall diffusion barrier layer over the capacitor stack.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
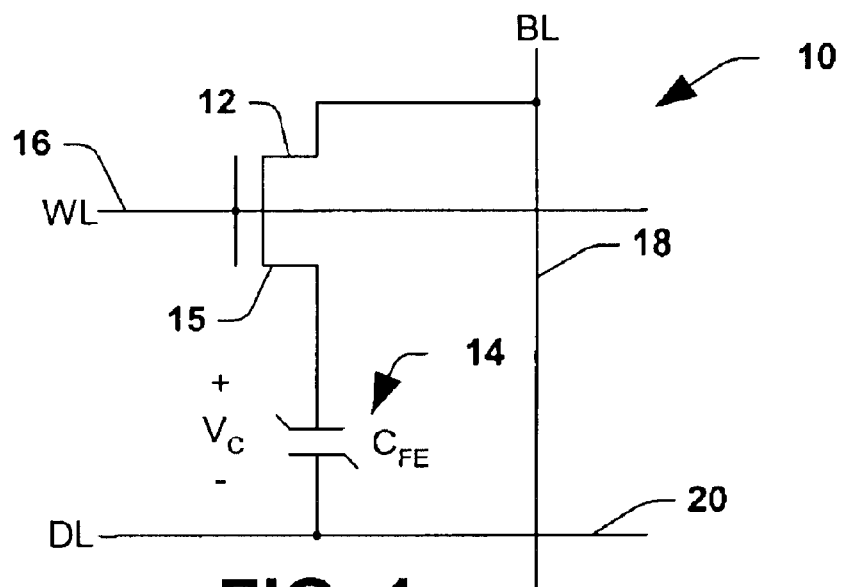
FIG. 1 is a prior art schematic diagram illustrating an exemplary 1T/1C FRAM memory cell.
Figure 2:
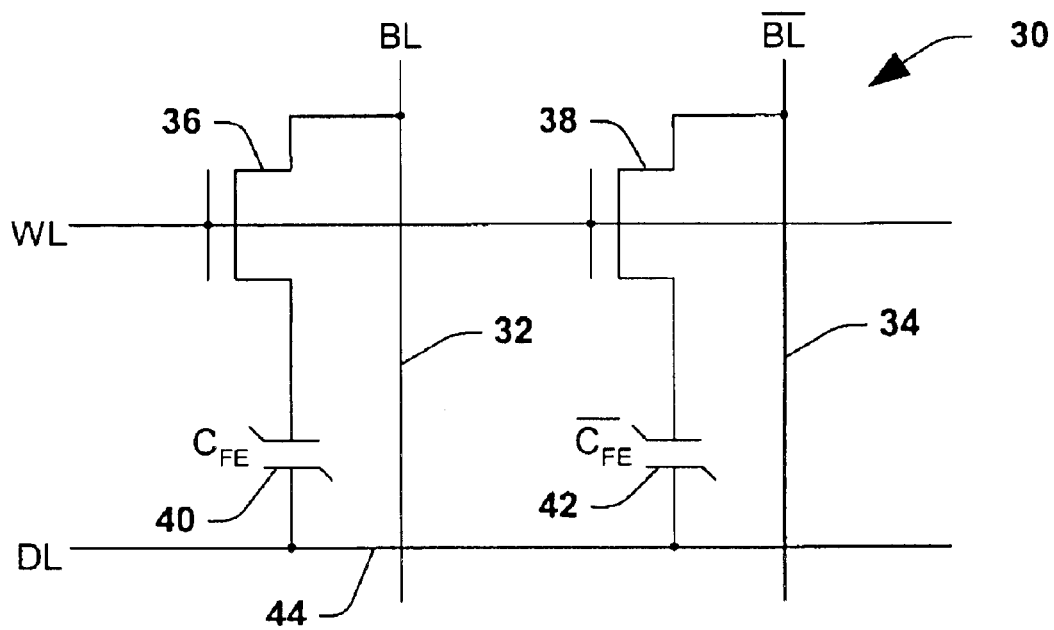
FIG. 2 is a prior schematic diagram illustrating an exemplary 2T/2C FRAM memory cell.

The present invention will now be described with reference to the attached drawings, wherein like reference numerals are used to refer to like elements throughout. The invention relates to a method of forming a ferroelectric capacitor structure wherein formation of the contact opening through the overlying dielectric down to the capacitor structure is performed in a single etch chamber.

Figure 3:
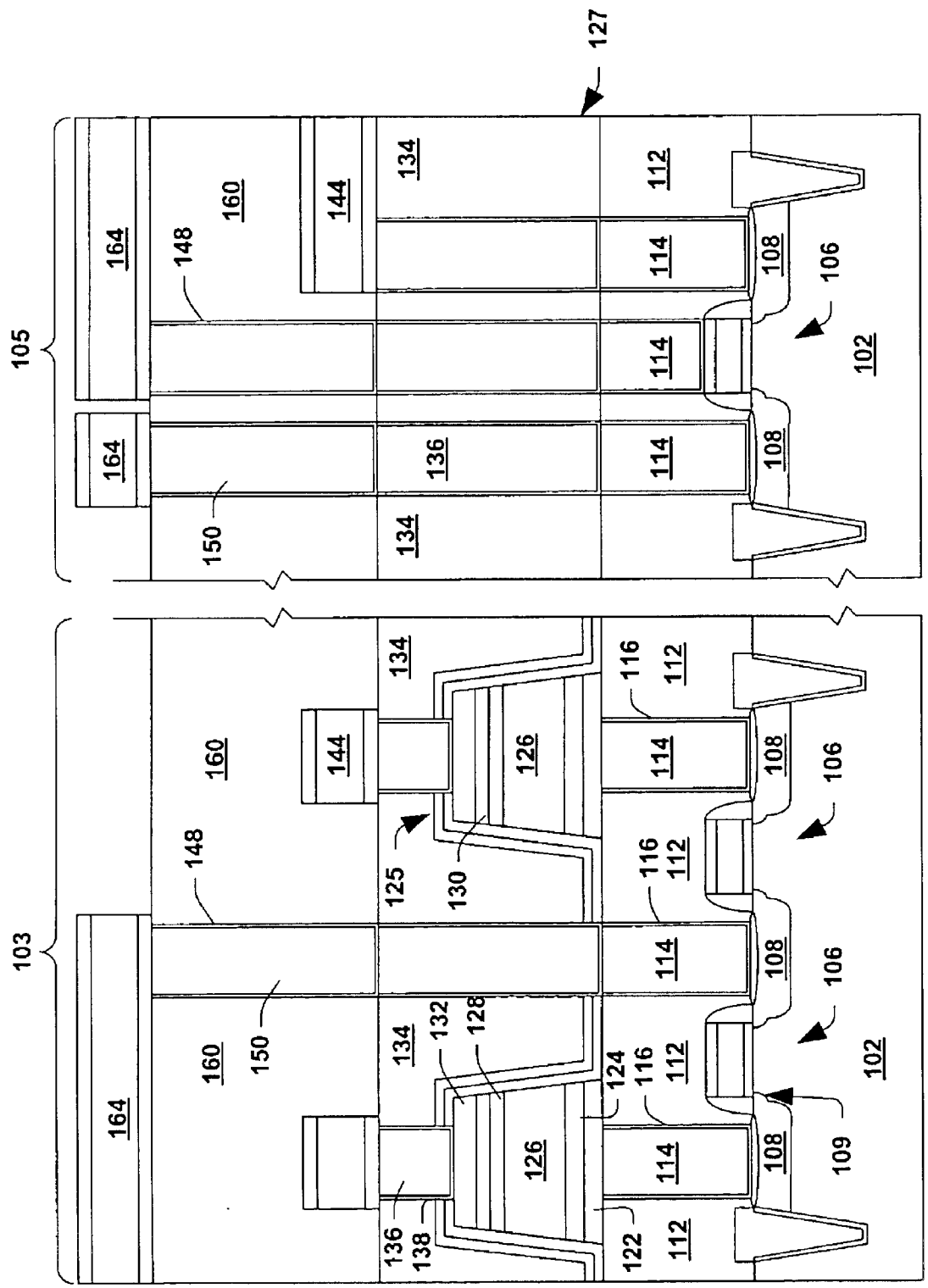
FIG. 3 is a fragmentary cross section diagram illustrating an exemplary ferroelectric memory device.
Figure 4:
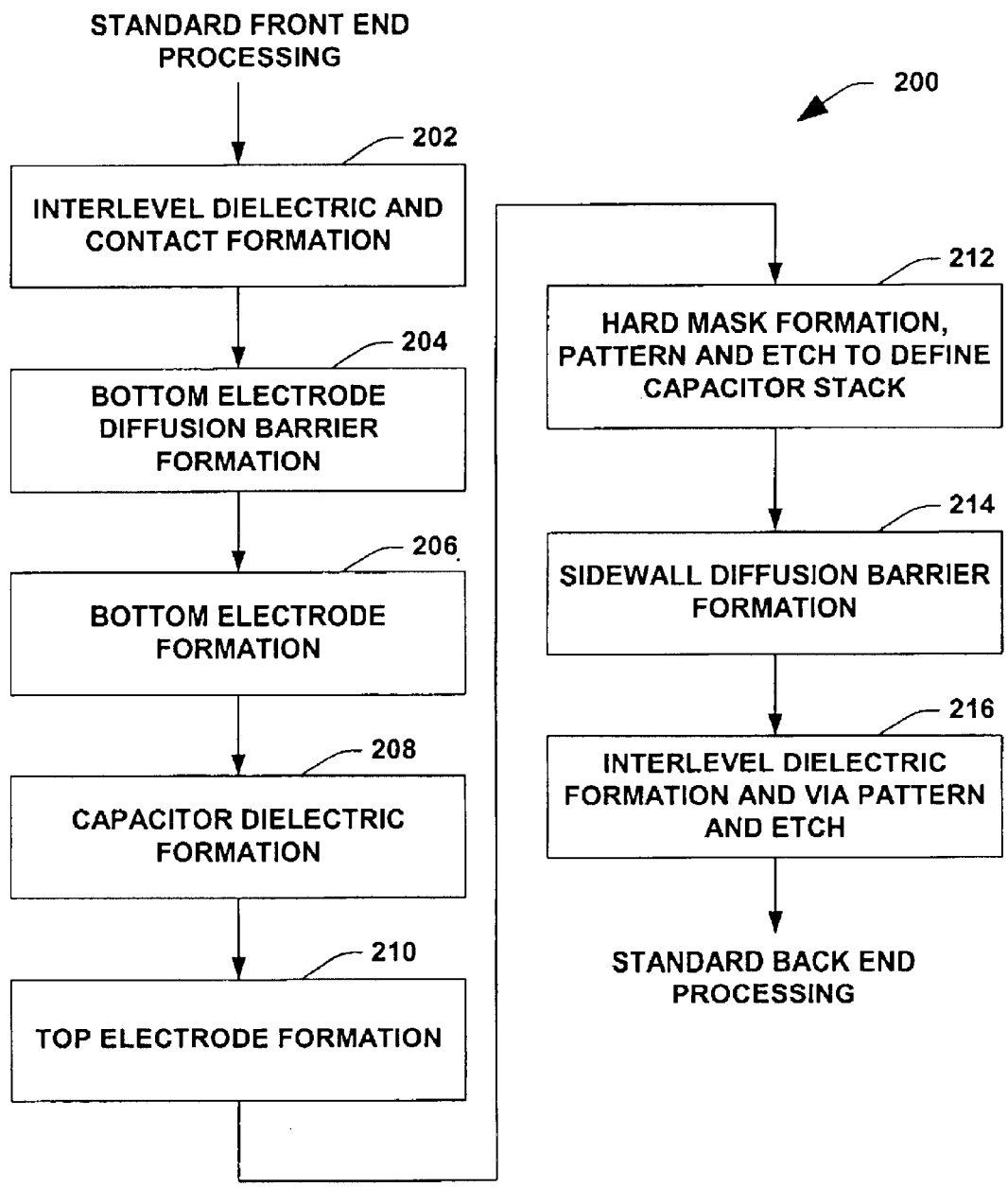
FIG. 4 is a flow chart diagram illustrating various actions involved in the formation of a ferroelectric memory device.

In order to fully appreciate the various aspects of the present invention, a brief description of an exemplary ferroelectric memory device and a fabrication process associated therewith is provided. Referring initially to FIGS. 3 and 4, an exemplary, fragmentary cross section of a semiconductor device is provided in which two devices are illustrated. A first device 103 represents a partially fabricated version of an FRAM cell in accordance with the present invention, and a second device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in the device 103, the structures utilized therein may be the same as the device structures of the device 105 (except for some possible variations in the transistors due to the different device types that device 105 may be).

Basically, gate structures 106 include a gate dielectric, a gate electrode (e.g., doped polysilicon with a silicide formed thereon). The gate structures 106 further comprise sidewall insulators (e.g., comprising an oxide, a nitride, an oxynitride, or a combination or stack thereof). Source/drain regions 108 may be formed via, for example, implantation using conventional dopants and processing conditions. Lightly doped drain extensions 109 as well as pocket implants may also be utilized. In addition, the source/drain regions 108 may be silicided (for example, with titanium, cobalt, nickel, tungsten or other conventional silicide material).

A dielectric layer 112 is formed over the substrate 102 and is patterned and etched so as to form openings for contacts to the substrate and gate structures 106 to be formed (see, e.g., 202 of FIG. 4). These openings are filled subsequently with one or more conductive materials, such as a plug 114 (e.g., comprising a metal such as tungsten, molybdenum, titanium, titanium nitride, tantalum nitride, or a metal silicide such as Ti, Ni or Co, copper or doped polysilicon). A liner/barrier layer 116 may or may not be formed between the plug 114 and dielectric 112. Such a liner/barrier layer 116 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 112 comprises, for example, $SiO_2$ (doped or undoped with preferable dopants such as boron or phosphorous) possibly with a layer of hydrogen or deuterium containing silicon nitride next to the gate. After deposition of the diffusion barrier 116 it is likely that the barrier will be planarized for improved lithography of overlying layers using a process such as chemical mechanical polishing (CMP). In addition, an added diffusion barrier/etch stop (not shown) may be included near the top surface of layer 112 such as $AlO_x$, AlN, $Si_3N_4$, $TiO_2$, $ZrO_2$, or TaOx that would be deposited after the planarization process. This diffusion barrier is particularly useful if damascene processes are used to create the via or metallization to the contact. The formation of the plug 114 will require etching through this optional barrier/etch stop.

Formation of metal structures that are situated above the contacts is considered to be part of the back end processes. Other than the specific FRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 112, 134 and 160). If formed, this thin dielectric comprises, for example, silicon nitride, silicon carbide, SiCNO or a silicon oxide (for example, a high-density plasma oxide). In addition, interlevel dielectric layers 112, 134, and 160 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 136 and 150 and conductors 144 and 164 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 138 and 148 and liners 142, 146, 162 and 166) comprises, for example, Ti, TiN, W, tungsten nitride, Ta, tantalum nitride, any conventional barrier/liner layer, or any combination or stack thereof). The interlayer dielectric and plug material should be compatible with the FRAM thermal budget. With existing technology (i.e., one that incorporates a W plug and $SiO_2$ ILD), the FRAM thermal budget should be less than approximately 600 or 650 C, however, the present invention is not limited thereto. If the ILD is modified to include a low dielectric constant ("low K") layer, the FRAM thermal budget may need to be reduced further. The preferred interlayer dielectric 112 is therefore a material that can withstand a thermal budget in excess of 600 C, such as silicon oxide (doped and/or undoped), FSG, silicon nitride, and/or silicon oxynitride.

Level 127 (FRAM process module) is added so as to accommodate the FRAM cells. This FRAM process module allows the creation of ferroelectric or high dielectric constant capacitors to be added with maximum thermal budget for the new process module yet not impact the thermal budget of backend process. In particular, this level allows FRAM devices with capacitor under bit line configuration compatible with a high-density memory. However, it is possible, if planarity is not a necessity, to form the FRAM devices while not forming layer 127 in region 105. Hence, the FRAM portion 103 would be taller than the region 105 by the height of layer 127.

Initially, a further discussion of FIG. 3 will be provided to appreciate the structure of an FRAM cell and an exemplary integration position of such a cell within a semiconductor fabrication process. Subsequently, a flow chart and a number of fragmentary cross section diagrams will be provided to illustrate an exemplary process for fabricating such an FRAM cell in order to understand the invention as will be set forth in greater detail infra.

An FRAM capacitor, as illustrated in FIG. 3 at reference numeral 125, resides above the interlayer dielectric 112, and comprises several layers. The FRAM capacitor 125 of FIG. 3 comprises an electrically conductive bottom electrode barrier layer 122 upon which a conductive bottom capacitor electrode 124 resides (hereinafter, the terms conductive and insulative are employed to indicate electrically conductive and electrically insulative, respectively, unless indicated otherwise). A capacitor dielectric layer 126, a ferroelectric material, is formed over the bottom electrode 124, and is covered by, for example, a conductive multi-layer top electrode 128, 130. A top portion of the FRAM capacitor 125 comprises a hard mask layer 132 which may be employed to facilitate the capacitor stack etch. The capacitor stack is then covered by a sidewall diffusion barrier 118, 120 (which may be a single or multi-layer barrier).

At 202, the interievel dielectric 112 is formed and conductive contacts, for example, tungsten (W) contacts 114 are formed therein with a barrier layer 116 (e.g., TiN) disposed therebetween to avoid oxidation of the tungsten contacts. Formation of the interlayer dielectric 112 and the contacts 114 may be formed by various means. Then the FRAM capacitor(s) are formed over the interlayer dielectric 112 and the contacts 114, as illustrated in FIG. 3.

In one example, the bottom electrode diffusion barrier layer 122 is formed over the interlayer dielectric 112 and the tungsten contact 114 prior to the formation of the bottom electrode 124 at 204. Such a barrier is electrically conductive and serves to provide an effective diffusion barrier without having to increase a thickness of the bottom electrode substantially. The bottom electrode diffusion barrier material may be, for example, TiN and TiAlN, and be formed via physical vapor deposition.

After the bottom electrode diffusion barrier layer 122 is formed at 204, the bottom electrode layer 124, the ferroelectric dielectric layer 126, and the top electrode layer 128, 130 are deposited at 206, 208 and 210, respectively. Subsequently, a hard mask layer 132 is deposited and the capacitor stack is etched using the hard mask to self-align one or more FRAM capacitor stacks at 212, as illustrated in FIGS. 3 and 4.

After fabrication of the capacitor stack, an insulating sidewall diffusion barrier 140 (e.g., AlOx) is deposited at 214 in order to protect the FRAM capacitor from hydrogen contamination, and also to protect other structures from lead contamination if the ferroelectric dielectric 126 is PZT. In some cases the sidewall barrier 140 is a multi-layer with two possible materials, the first material being AlOx or one of the materials highlighted above, and the second layer comprising SiN or AlN. The FRAM capacitor fabrication portion is then substantially completed by the deposition thereover of a dielectric material followed by a VIA0 etch at 216 to make contact down to the top portion of the ferroelectric capacitor as well as down to the underlying layer to contact any electrical contacts 114 for connection to underlying circuitry, etc.

The inventors of the present invention appreciated that a conventional full sidewall barrier layer etchback technique employed for forming the contact down to the capacitor (sometimes referred to as the VIA0 etch) could result in degradation to the ferroelectric dielectric 126 due to hydrogen contamination during subsequent dielectric deposition. Such hydrogen contamination is disadvantageous since the hydrogen tends to degrade the polarization fatigue resistance of the ferroelectric capacitors, particularly when PZT is employed as the ferroelectric dielectric material therein. This consequence may be more fully appreciated in FIGS. 5A–5D and the following discussion of a sidewall etchback process for forming the VIA0 contact.

Figure 5A:
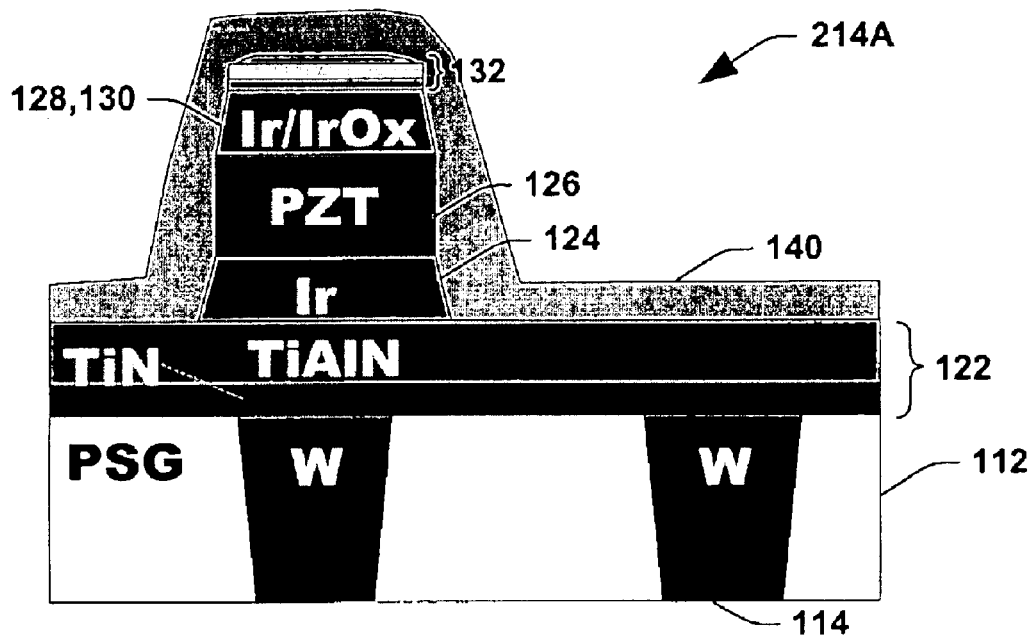
FIGS. 5A–5D are fragmentary cross section diagrams illustrating various stages of forming a ferroelectric capacitor using a full sidewall etchback technique.

In FIG. 5A, the capacitor stack has been defined by etching using the hard mask 132 (e.g., a multi-layer hard mask as illustrated), wherein the capacitor stack comprises the bottom electrode 124 (e.g., Ir or Ir/IrOx), the ferroelectric dielectric 126 (e.g., PZT), and the top electrode 128, 130 (e.g., Ir or Ir/IrOx). As illustrated in the present example, the capacitor stack resides on a conductive bottom electrode diffusion barrier 122, and an insulative sidewall diffusion barrier layer 140 (e.g., AlOx) covers the capacitor stack at 214A.

Figure 5B:
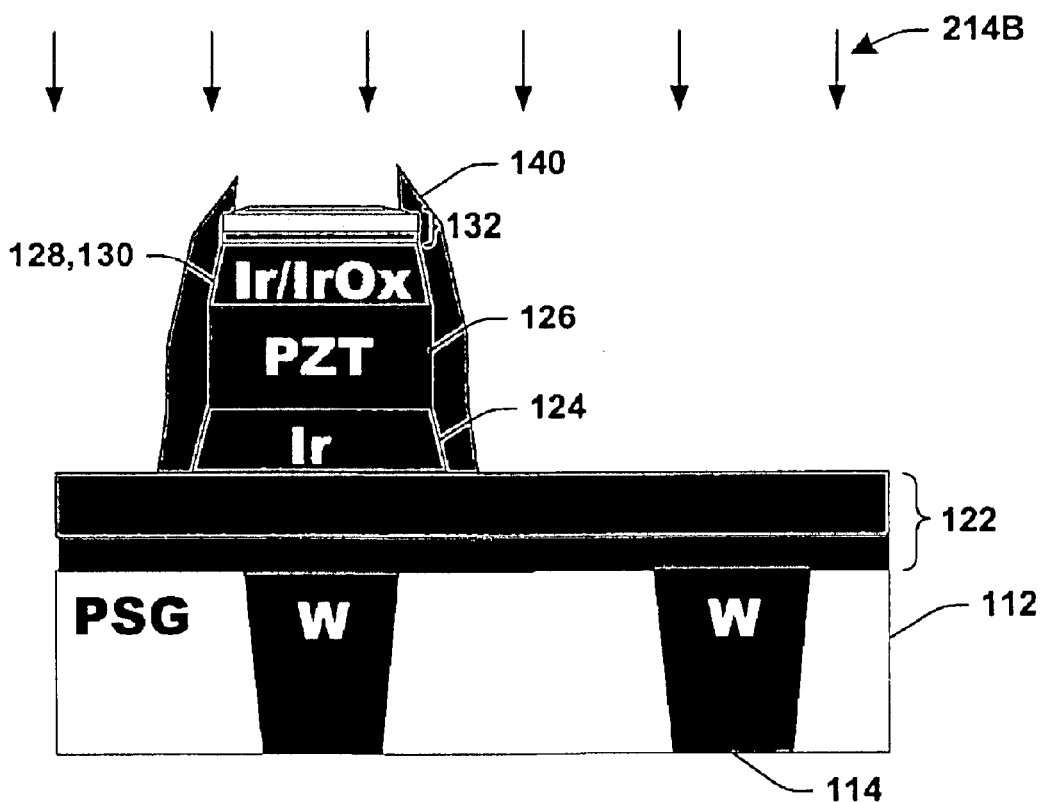
Figure 5C:
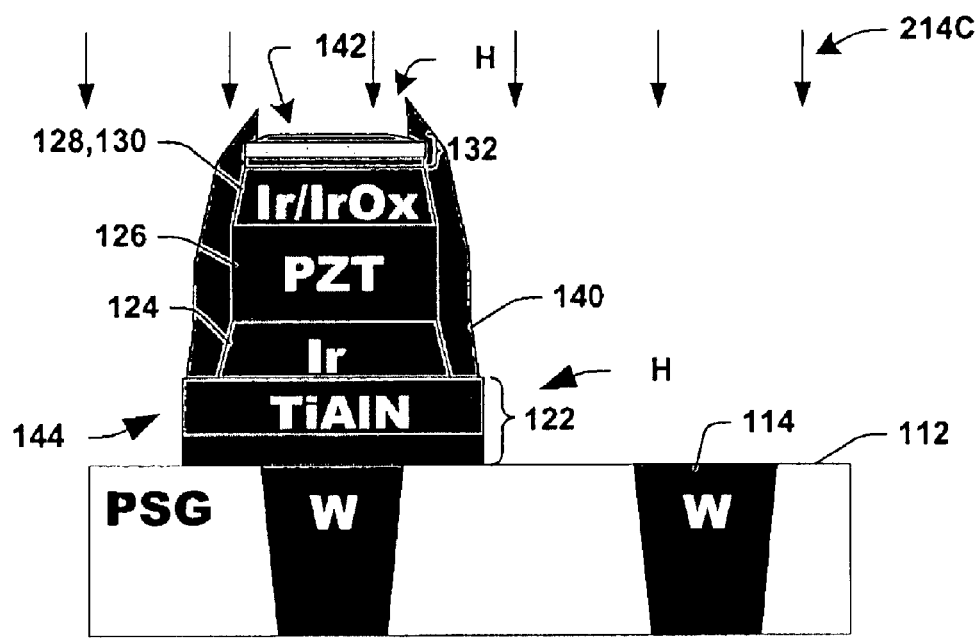
Figure 5D:
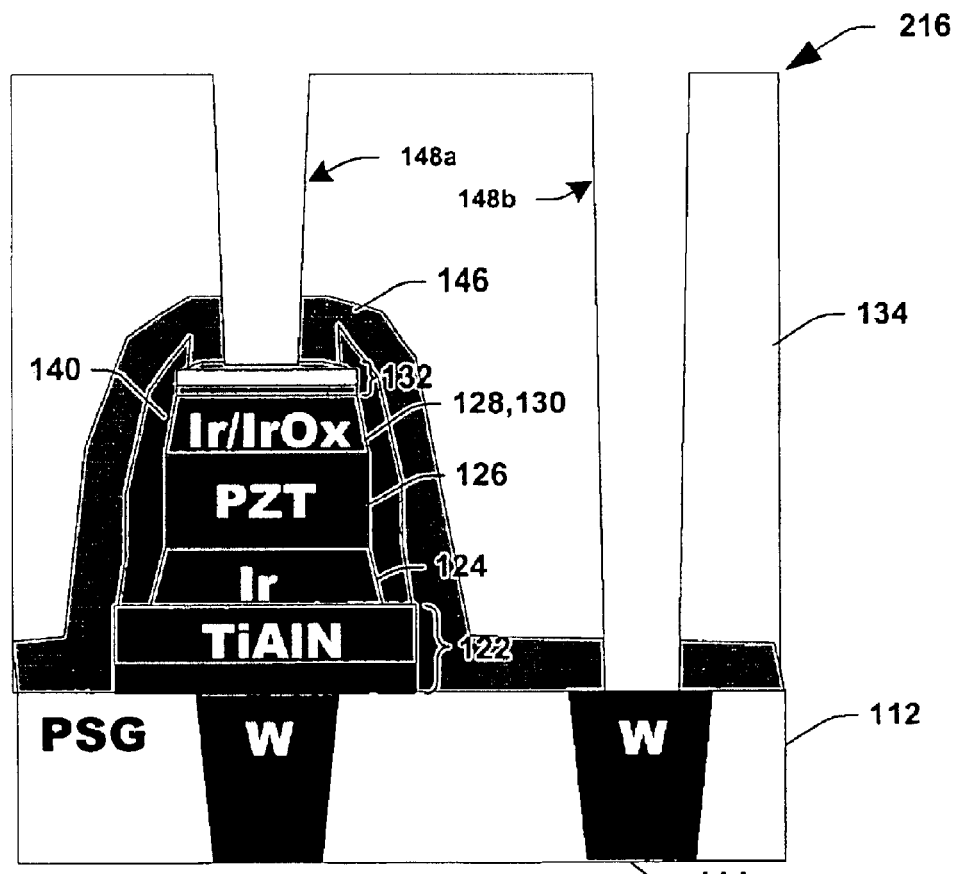

The sidewall diffusion barrier layer is then patterned at 214B to expose the hard mask 132 as shown in FIG. 5B, and the exposed bottom electrode diffusion barrier layer is then patterned at 214C using, for example, a dry etch process. The resulting structure is illustrated in FIG. 5C, wherein absence of the sidewall diffusion barrier layer at locations 142 and 144 allows for exposure of the capacitor stack to hydrogen contamination (H) during subsequent processing steps. For example, an etch stop layer 146 is deposited followed by an interlayer dielectric 134. The dielectric 134 typically is formed under conditions containing hydrogen and thus may lead to hydrogen contamination of the PZT 126.

At 216, the VIA0 contact is formed by etching through the dielectric 134, wherein the etch is selective to the etch stop layer 146 such that the region or contact opening (via) 148a on top of the capacitor stack can be overetched without substantial effect thereto while the contact opening or via 148b continues down to the conductive contact 114. A second etch is then performed at 270 to open the etch stop layer 146 in the openings 148a and 148b. As can be seen using the above sidewall etchback process, the capacitor stack is potentially vulnerable to hydrogen contamination (see FIG. 5C) that can degrade the ferroelectric capacitor performance characteristics, for example, the capacitor fatigue resistance.

Figure 6A:
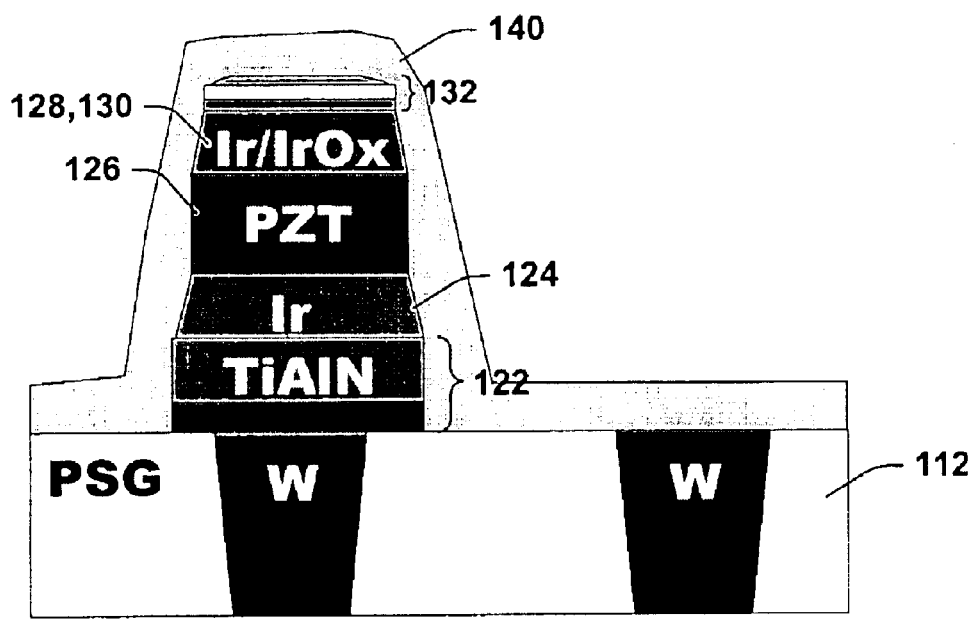
FIGS. 6A–6C are fragmentary cross section diagrams illustrating various stages of forming a ferroelectric capacitor employing a non-sidewall etchback technique.
Figure 6B:
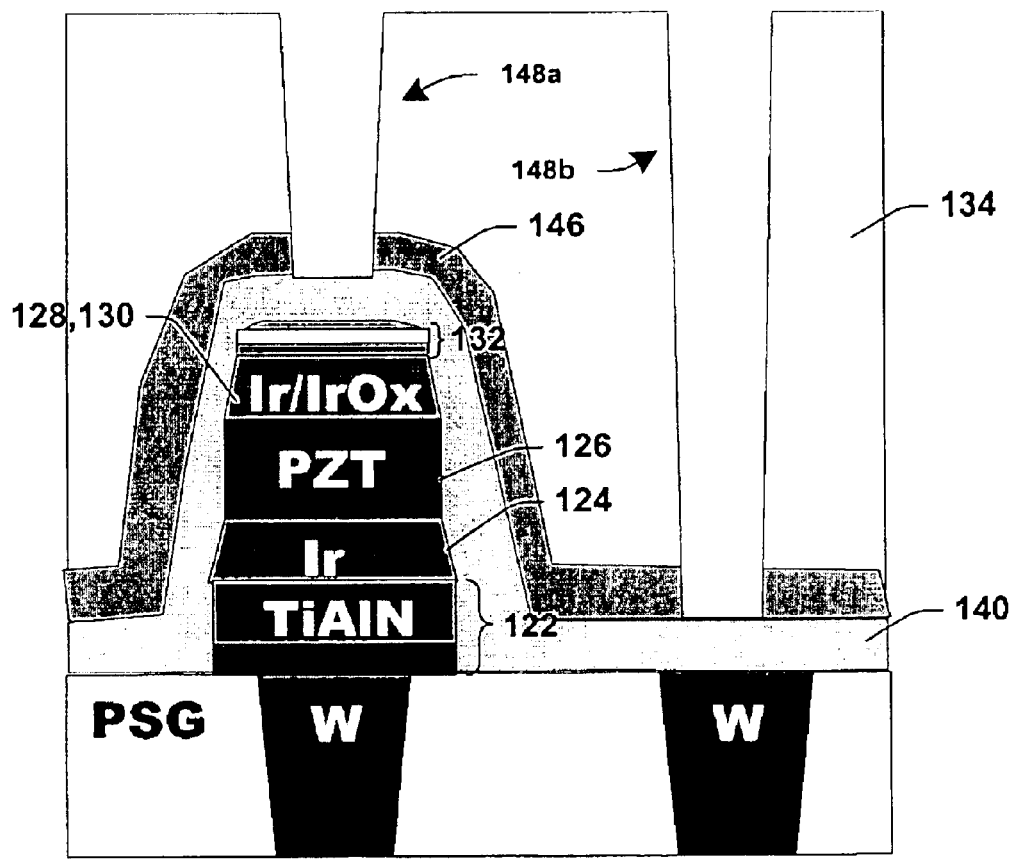
Figure 6C:
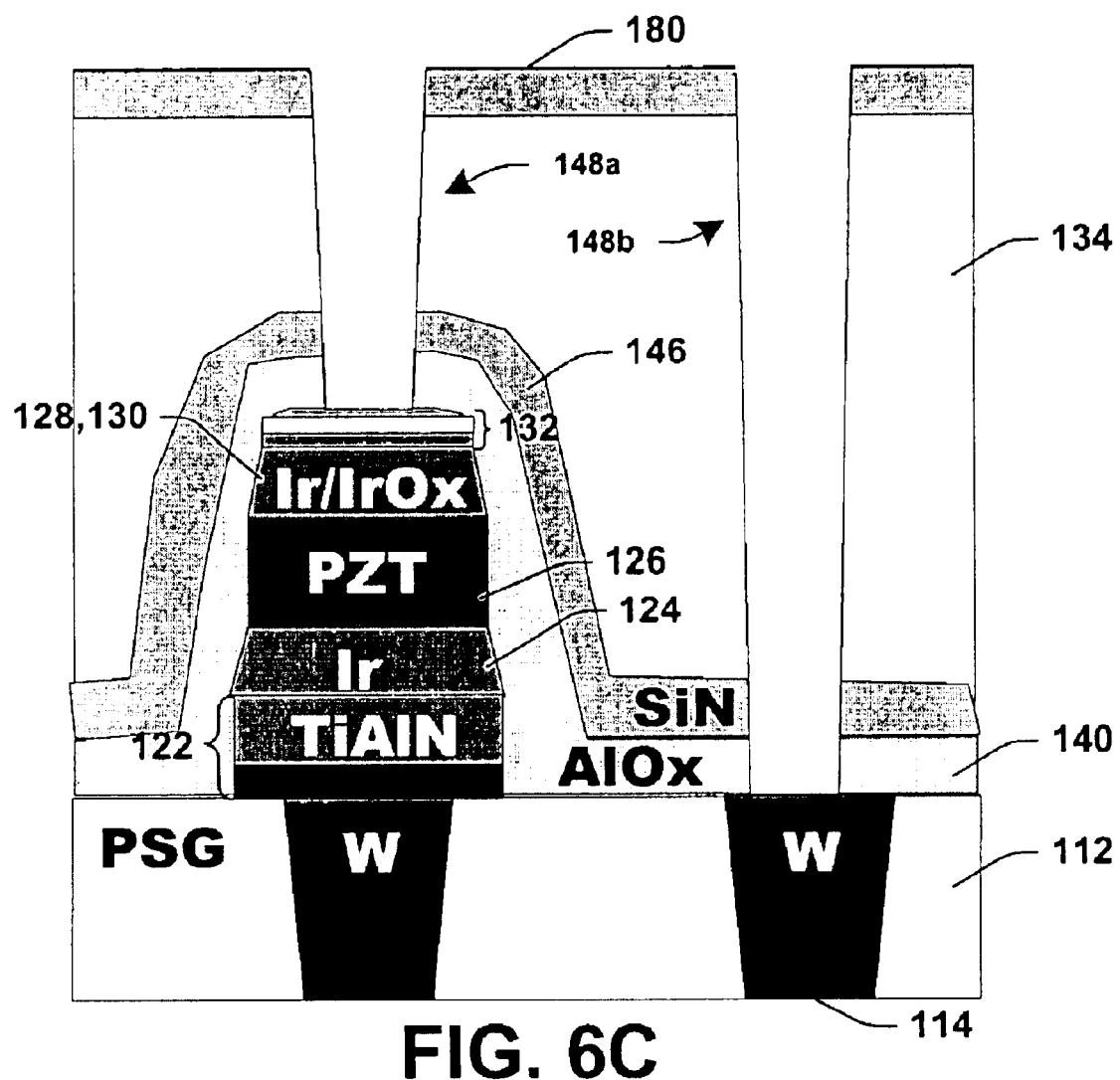

One solution to address the above problem associated with potential hydrogen contamination is a non-sidewall etchback process, as set forth in FIGS. 6A–6C. Initially, upon patterning the capacitor stack using the hard mask 132, etching continues and the bottom electrode diffusion barrier 122 is etched as illustrated in FIG. 6A. The sidewall diffusion barrier layer 140 is then formed over the capacitor stack, including the patterned bottom electrode diffusion barrier 122, as shown.

An etch stop layer is then formed over the sidewall barrier layer 140 and the capacitor stack, followed by the dielectric layer 134, as illustrated in FIG. 6B. Contact holes or vias 148a and 148b are formed in the dielectric 134. The contact hole etch initially stops on the etch stop layer 146 and a second etch is performed to etch through the etch stop layer, as illustrated in FIG. 6B. A third etch is then performed to remove the exposed sidewall diffusion barrier layer 140 within the contact holes. These etches together are sometimes referred to as the VIA0 etch.

Because the sidewall diffusion barrier layer 140 is a substantially different material (e.g., aluminum oxide), the third etch to complete the VIA0 etch is performed in a different etch tool with a substantially different etch chemistry. For example, wherein the first two etches are performed in a first etch tool, for example, a DRM (dipole ring magnet) etcher manufactured by Tokyo Electron (TEL), the third etch is fabricated in a second etch tool, for example, a DPS (decoupled plasma source) etcher manufactured by Applied Materials. In addition, the etch chemistries in the above processes vary substantially. For example, the first etch (of dielectric 134) is a fluorocarbon-oxygen etch, the second etch (of the etch stop 146) is a $CH_2F_2/O_2$ type etch, and the third etch (sidewall barrier 140) is a $Cl_2/BCl_3$ type etch.

In addition, as illustrated in FIG. 6C, a hard mask layer 180 is employed on top of the dielectric 134 in order to minimize damage to the dielectric layer during the multi-step etch process. Even with the hard mask 180, however, damage has been found at a top portion thereof resulting in "fluting", and in some extreme cases can result in shorting between neighboring contacts, as will be appreciated further below.

The present invention is directed to a VIA0 contact etch process that can be performed in a single etch tool, and such process improves the process throughput. Further, the VIA0 contact etch process of the present invention has been found to result in higher quality contacts as compared to conventional processes resulting in improved device yield, as will be further appreciated below.

Figure 7:
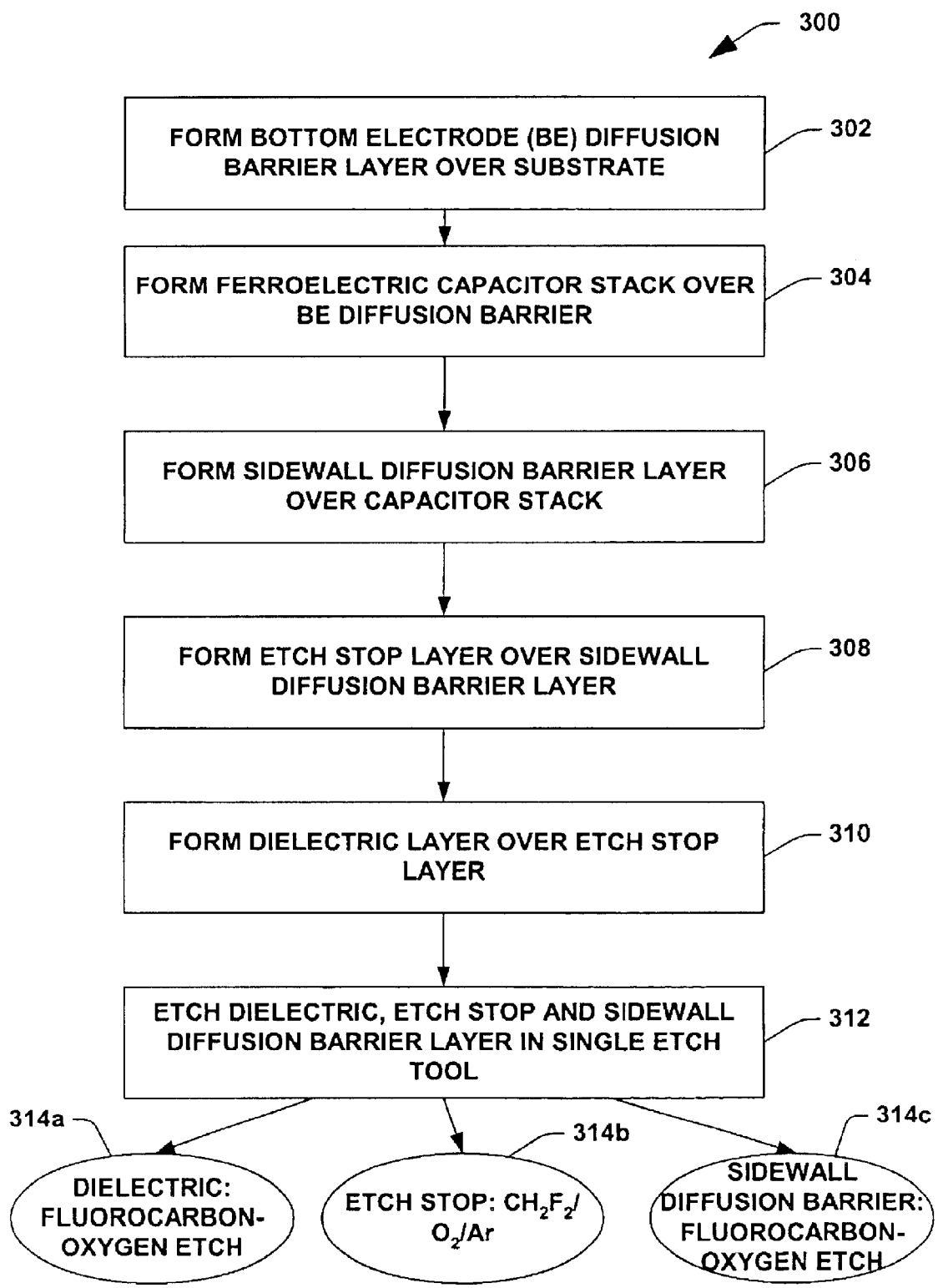
FIG. 7 is a flow chart diagram illustrating a method of forming a contact via for a ferroelectric capacitor using a single etch tool in accordance with the present invention.

A method of performing a VIA0 contact etch in conjunction with a ferroelectric capacitor is illustrated in FIG. 7, and designated at reference numeral 300. Although the method 300 and other methods herein are illustrated and described below as a series of acts or events, it will be appreciated that the resent invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication and/or processing of the ferroelectric devices that are illustrated and described herein as well as in association with other structures not illustrated.

The method 300 begins at 302, wherein a bottom electrode diffusion barrier layer is formed over a substrate or semiconductor body. As described earlier, the bottom electrode diffusion barrier layer is electrically conductive and provides a diffusion barrier for the device. In one example, the bottom electrode diffusion barrier layer is a multi-layer of TiN and TiAlN, respectively, however, single layer films of other compositions may be employed and are contemplated as falling within the scope of the present invention.

A ferroelectric capacitor stack is then formed over the bottom electrode diffusion barrier layer at 304. The capacitor stack may comprise, in one example, a bottom electrode layer, a ferroelectric dielectric layer, a top electrode layer, and a hard mask layer. For example, the bottom electrode layer may comprise a multi-layer film of iridium and iridium oxide, respectively, while the ferroelectric dielectric material may comprise PZT. Further, the top electrode layer may comprise, for example, a multi-layer film of iridium oxide and iridium, and the hard mask may comprise, for example, a multi-layer mask of TiAlN and TiAlON.

The capacitor stack definition at 304 continues with a patterning of the hard mask using, for example, a patterned photoresist or other mask layer, followed by an etch of the capacitor stack layers using the patterned hard mask. The capacitor stack etch results in the patterning of the top and bottom electrodes, the ferroelectric dielectric and the bottom electrode diffusion barrier layer, respectively. A sidewall diffusion barrier layer is then formed over the capacitor stack at 306, followed by the formation of an etch stop layer over the sidewall barrier at 308. In one example, the sidewall diffusion barrier layer comprises aluminum oxide, and the etch stop layer comprises a silicon nitride (e.g., SiN).

A dielectric layer, for example, $SiO_2$ or any dielectric material containing a silicon oxide therein, is then formed over the sidewall diffusion barrier layer and the etch stop layer at 310, and a VIA0 etch is then conducted at 312 to contact down to a top portion of the capacitor stack as well as down to the substrate or semiconductor body to contact other devices associated with the device. In accordance with the present invention, the VIA0 contact etch is performed in a single etch tool, and performance within the single tool improves the process throughput. In addition, the etch process associated with the sidewall diffusion barrier layer is not a $BCl_3$ and $Cl_2$ based process as in the conventional process, but instead employs a fluorocarbon-oxygen based process similar to that employed to pattern the dielectric. Use of such etch allows the multi-step etch to be performed in a single tool and also provides for an improved contact.

The VIA0 contact etch 312 initially comprises an etch of the dielectric material using a fluorocarbon-oxygen based etch at 314a. In one example, the etch is performed in a TEL DRM tool and comprises $C_5F_8/O_2/Ar$ with flow rates of about 6/5/500, respectively, performed at a power of about 1500 W for about 30 seconds. The second etch at 314b is an etch of the exposed portions of the etch stop layer in the etched portions of the dielectric. The second etch is performed in the same tool and comprises, for example, $CH_2F_2/O_2/Ar$ with flow rates of about 20/20/100, respectively, performed at a power of about 500 W for about 25 seconds. The third etch at 314c is then directed to the exposed portions of the sidewall diffusion barrier layer in the patterned portions of the dielectric and etch stop layers, respectively. The third etch is again performed in the same tool and comprises, for example, the same etch recipe as the first etch, $C_5F_8/O_2/Ar$ with flow rates of about 6/5/500, respectively, performed at a power of about 1500 W for about 30 seconds. Note that the tool highlighted above is provided for illustration purposes and that other tools may be employed in accordance with the present invention.

The use of a single tool for the VIA0 contact etch improves the process throughput associated therewith substantially. It is estimated that use of a single etch tool instead of multiple tools reduces the process time for the entire VIA0 etch process by about 50%. In addition, as will be further appreciated and discussed below, use of the above process provides for improved contacts, advantageously resulting in yield improvements.

Figure 8A:
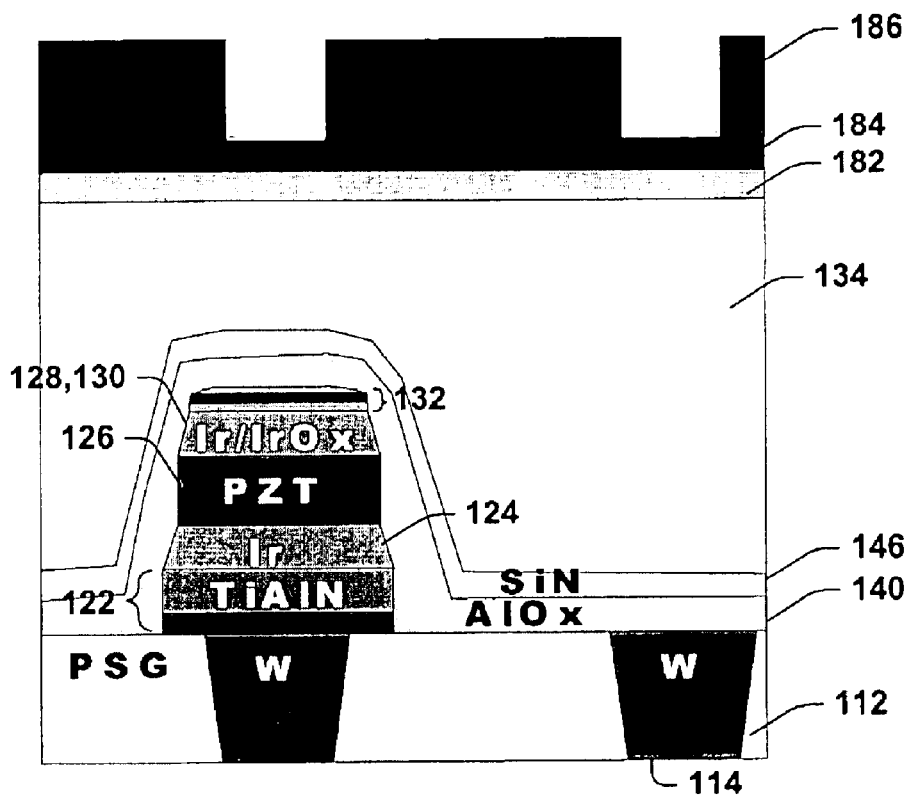
FIGS. 8A–8D are fragmentary cross section diagrams illustrating formation of contact via down to a ferroelectric capacitor according to one exemplary aspect of the present invention.
Figure 8B:
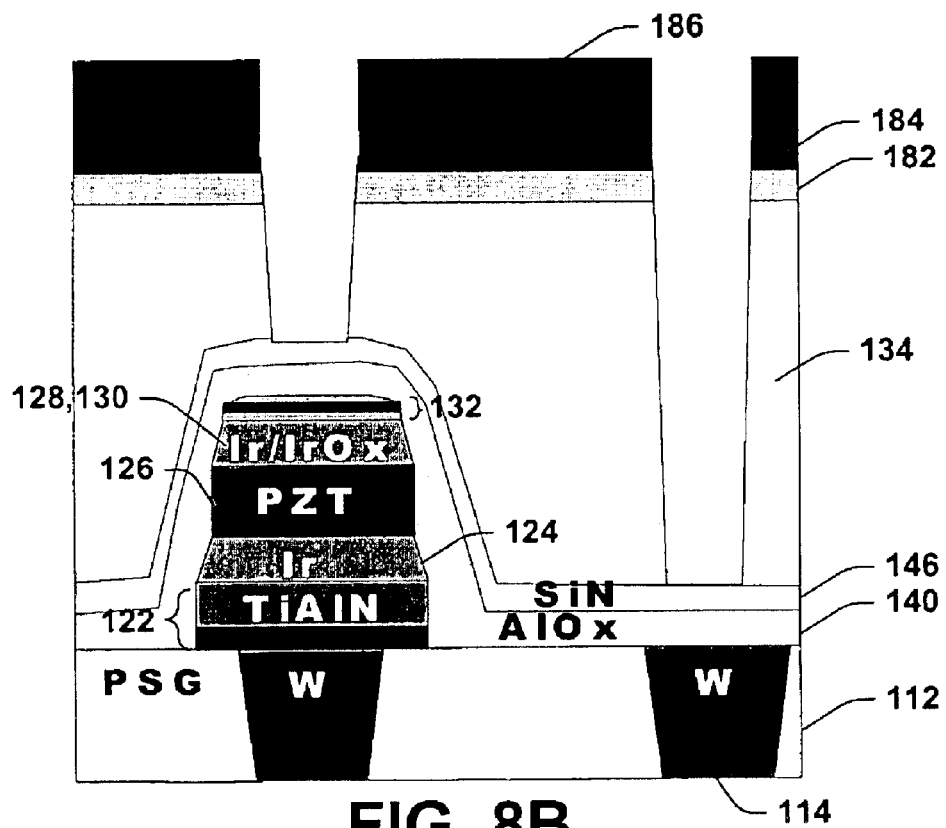

Exemplary cross section diagrams of the resultant structures of the method 300 of FIG. 7 are provided in FIGS. 8A–8D. In FIG. 8A, the capacitor stack structure has been covered by the etch stop layer 146 and the sidewall diffusion barrier layer 140, the etch stop layer 146 and the dielectric layer 134, respectively. In addition, an anti-reflective coating layer (BARC) 352, a hard mask 354 and a photoresist 356 overlie the dielectric 134. Since the conventional VIA0 etch process resulted in substantial "fluting" at the top of the contacts, the above layers 352 and 354 were employed to maintain the contact hole or via integrity. As illustrated in FIG. 8B, initially, the etch must etch through the hard mask 354 and BARC 352 before etching the dielectric 134 using the fluorocarbon-oxygen etch in the same tool. The etch then proceeds down to the etch stop layer in the same etch tool, substantially stopping thereon.

Figure 8C:
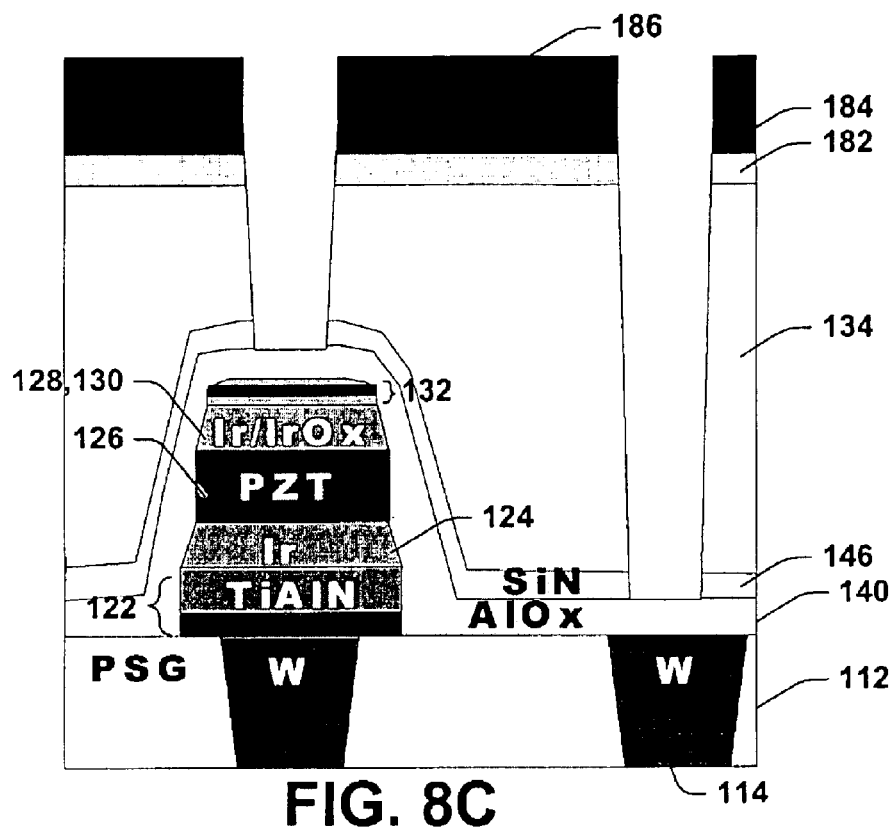
Figure 8D:
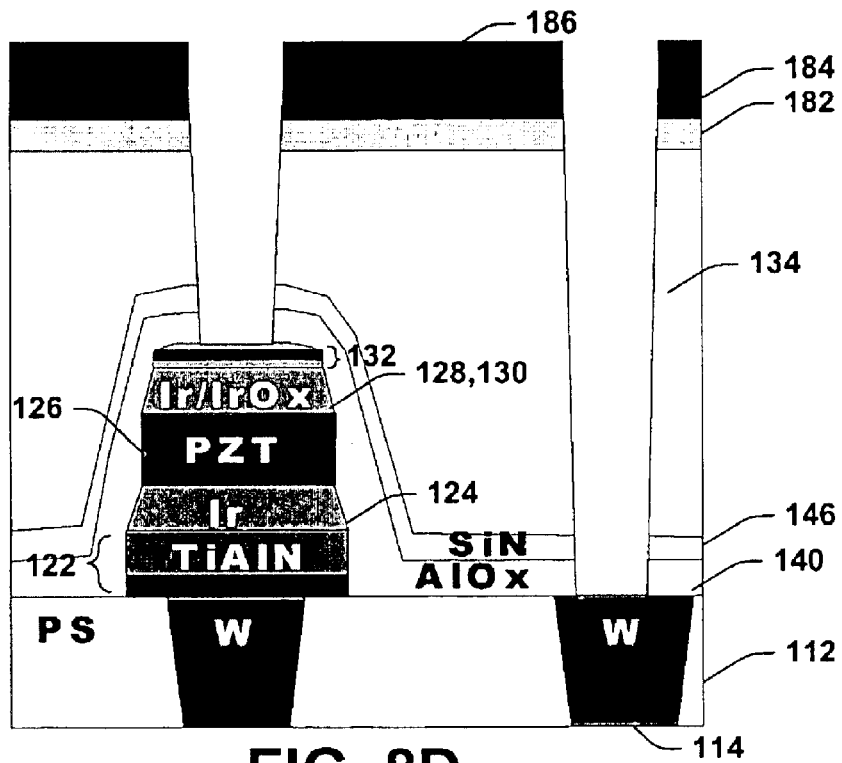

Continuing on, as illustrated in FIG. 8C, the etch stop layer 146 is etched, thereby exposing the underlying sidewall diffusion barrier layer 140. The etch then continues in the same etch tool and the sidewall diffusion barrier layer 140 is removed, as illustrated in FIG. 8D. The photoresist 186, hard mask 184 and BARC may then be stripped, thereby completing the VIA0 etch.

Figure 9:
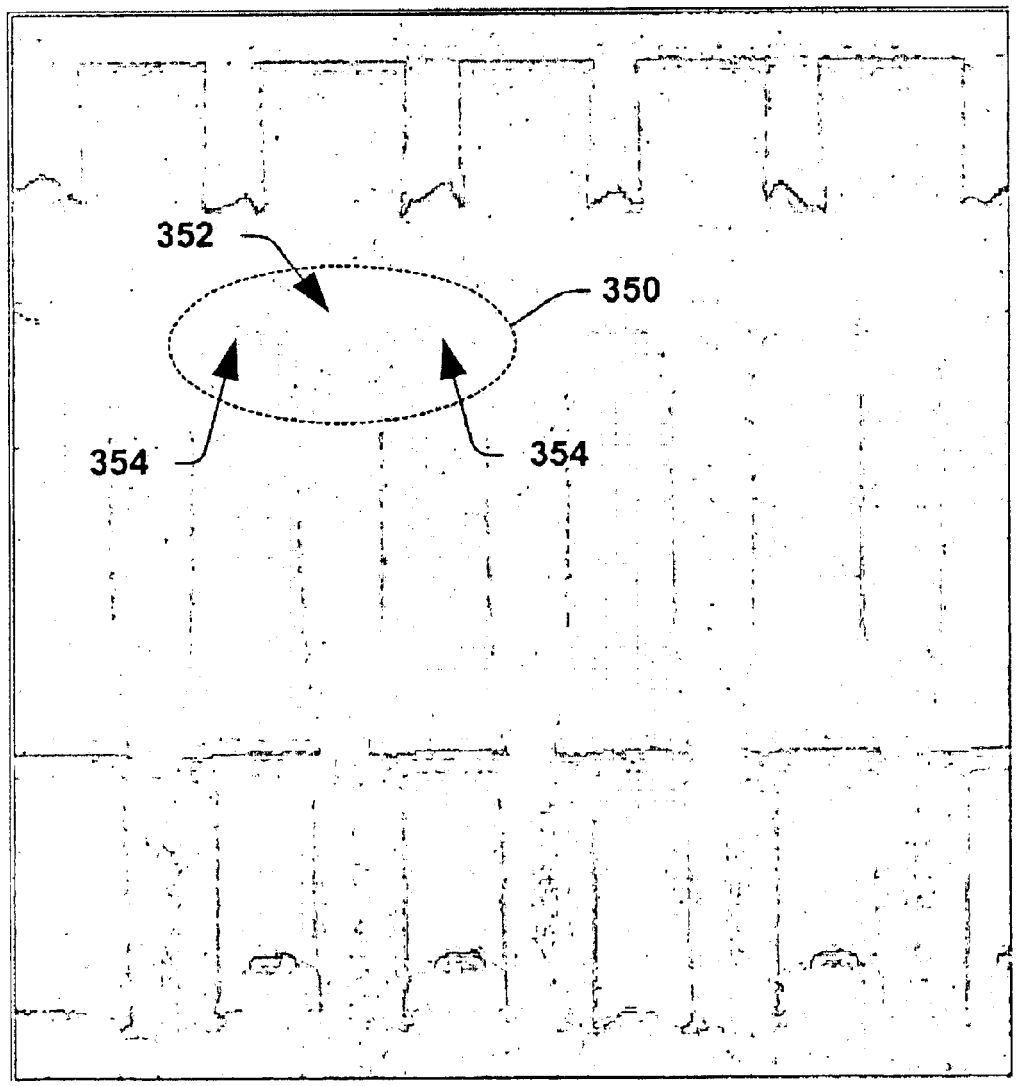
FIG. 9 is a fragmentary cross section of an SEM photograph illustrating test contact structures and the limitations associated therewith when fabricated in accordance with previous techniques.

As discussed earlier, the conventional VIA0 etch was substantially harsh on the dielectric layer 134, particularly with the etch chemistry employed with for the sidewall barrier. The result was "fluting" at the top portion of the contact. Such fluting, in extreme cases could result in neighboring contacts becoming shorted together. For example, FIG. 9 illustrates a scanning electron microscope (SEM) image of a number of test contact features using the conventional VIA0 etch process. Note that in region 350 a top portion 352 of the contacts flare outwardly, resulting in rounded regions 354 between the contacts where metal may reside. In subsequent processing, for example, a chemical mechanical polish, some metal between the contacts may remain, thereby causing those contacts to be electrically connected and disadvantageously "shorted" together.

Since the conventional VIA0 etch process resulted in such fluting, even with hard mask and BARC layers on top of the dielectric 134, the hard mask layer 184 and BARC layer 182 were employed initially, as illustrated in FIGS. 8A–8D. Further testing of the process of the present invention, however, found that the third etch (the etch of the sidewall diffusion barrier layer) using the fluorocarbon-oxygen chemistry resulted in very little degradation to the contact openings and that the process could be employed without the extra hard mask, thereby further simplifying the process.

Figure 10:
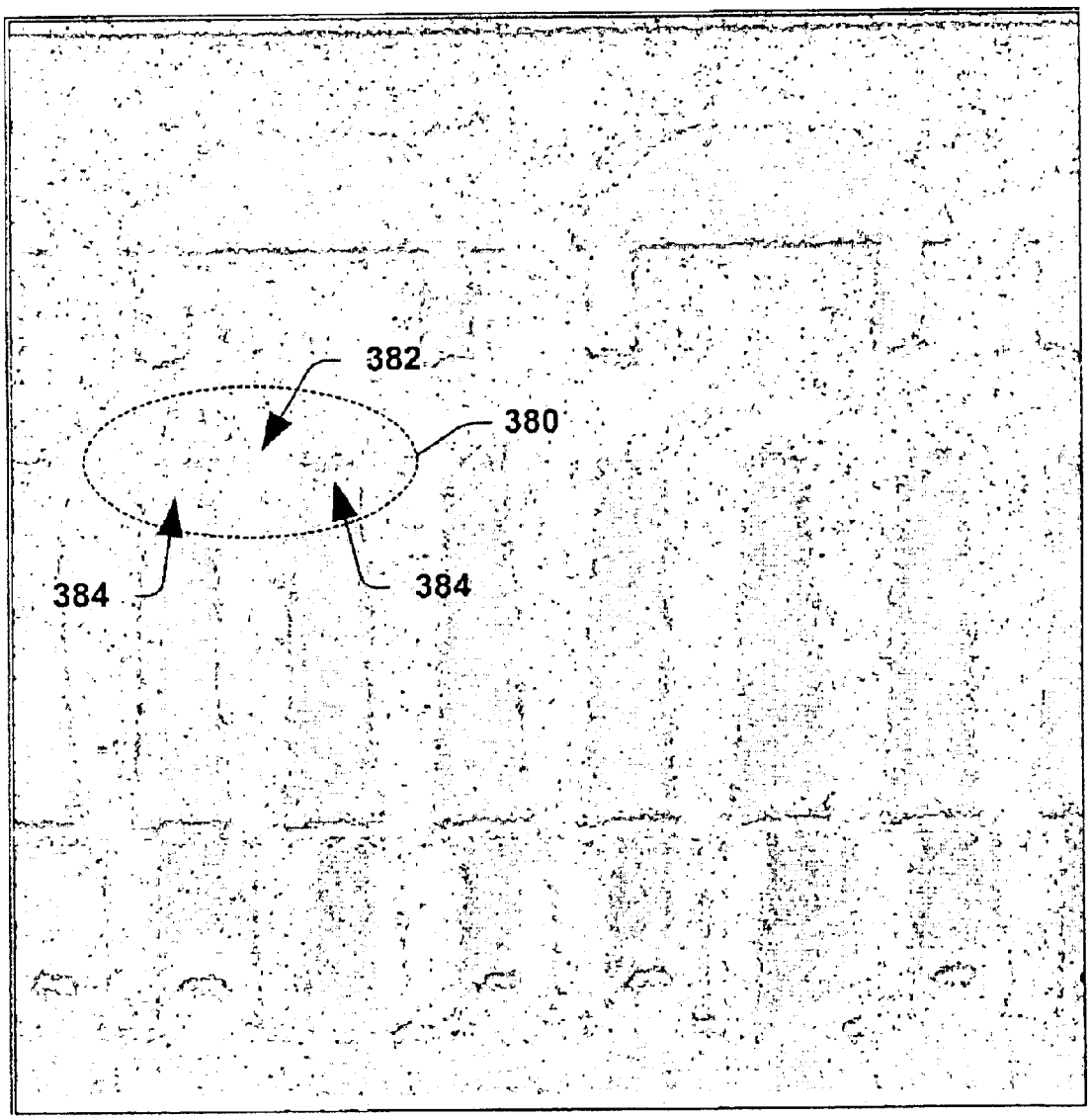
FIG. 10 is an SEM photograph illustrating a fragmentary cross section of test contact structures and the limitations associated therewith when fabricated in accordance with the present invention.

For example, as illustrated in FIG. 10, an SEM image is provided illustrating contact test structures similar to those of FIG. 9. The test structures of FIG. 10, however, were fabricated in accordance with the VIA0 etch process of the present invention, wherein the etch is performed in a single etch tool and wherein the etch of the sidewall diffusion barrier layer is performed with a fluorocarbon-oxygen based etch. Note that in region 380, the top portions 382 of the contacts are not rounded significantly, thereby rendering the regions 384 between the contacts fairly square. The advantageous result is that neighboring contacts that are intended to be electrically isolated from one another remain isolated, thereby substantially improving device yield.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming a ferroelectric capacitor, comprising:
   forming a ferroelectric capacitor stack over a substrate, the ferroelectric capacitor stack comprising a bottom electrode, a ferroelectric dielectric over the bottom electrode, and a top electrode over the ferroelectric dielectric;
   forming an aluminum oxide sidewall barrier layer over the ferroelectric capacitor stack;
   forming a dielectric layer containing silicon oxide over the aluminum oxide sidewall barrier layer;
   etching a contact via down to the aluminum oxide barrier layer in an etch chamber; and
   etching the contact via through the aluminum oxide barrier layer down to a top portion of the ferroelectric capacitor stack in the same etch chamber, thereby completing a contact via etch using a single etch chamber.

2. The method of claim 1, wherein the ferroelectric dielectric comprises PZT.

3. The method of claim 1, wherein forming the ferroelectric capacitor stack further comprises forming a bottom electrode diffusion barrier layer before the bottom electrode.

4. The method of claim 1, further comprising forming an etch stop layer over the aluminum oxide sidewall barrier layer before forming the dielectric layer containing silicon oxide thereover.

5. The method of claim 3, wherein forming the ferroelectric capacitor stack further comprises;
   forming the bottom electrode diffusion barrier layer, a bottom electrode layer, a ferroelectric dielectric layer, and a top electrode layer in succession over the substrate;
   forming a hard mask over the top electrode layer; and
   patterning the top electrode layer, the ferroelectric dielectric layer, the bottom electrode layer and the bottom electrode diffusion barrier layer in succession using the hard mask to define the capacitor stack.

6. The method of claim 4, wherein the etch stop layer comprises SiN.

7. The method of claim 4, wherein etching the contact via comprises:
   etching the dielectric layer down to the etch stop layer with a first etch chemistry, thereby exposing a portion of the etch stop layer;
   etching the exposed portion of the etch stop layer with ah second etch chemistry different than the first etch chemistry, thereby exposing a portion of the aluminum oxide barrier layer; and
   etching the exposed portion of the aluminum oxide barrier layer with the first etch chemistry.

8. The method of claim 7, wherein the first etch chemistry comprises a fluorocarbon-oxygen etch chemistry.

9. The method of claim 8, wherein the second etch chemistry comprises $CH_2F_2$, $O_2$ in combination with an inert gas comprising He, Ne, Ar, Kr, Xe or $N_2$ or mixtures thereof.

10. The method of claim 8, wherein the first etch chemistry comprises $C_5F_8$ and $O_2$ or $C_4F_8$ and $O_2$ in combination with an inert gas comprising He, Ne, Ar, Kr, Xe or $N_2$ or mixtures thereof.

11. The method of claim 10, wherein the first etch chemistry has flow ratios of the $C_4F_8$ or $C_5F_8$ and $O_2$ gases that are within approximately 25% of one another, and an inert gas flow of at least a factor of 10 higher than the fluorocarbon or oxygen flow rate.

12. The method of claim 9, wherein the second etch chemistry has flow ratios of $CH_2F_2$ and $O_2$ that are within about 25% of one another, and an inert gas flow of about 4 times greater than the flow rate of the $CH_2F_2$ or $O_2$.

13. A method of forming a ferroelectric capacitor, comprising:
   forming a first conductive contact and a second conductive contact in an insulating material overlying a substrate, wherein the first and second conductive contacts are laterally disposed from one another;
   forming a ferroelectric capacitor stack over the first conductive contact, wherein the ferroelectric capacitor stack comprises a bottom electrode, a ferroelectric dielectric overlying the bottom electrode, and a top electrode overlying the ferroelectric dielectric;
   forming an aluminum oxide sidewall barrier layer over the capacitor stack and the insulating material, thereby overlying the second conductive contact laterally disposed from the capacitor stack;
   forming an etch stop layer over the aluminum oxide sidewall barrier layer;
   forming a dielectric layer containing silicon oxide over the etch stop layer;
   etching the dielectric layer to form a first contact via associated with the ferroelectric capacitor stack and a second contact via associated with the second conductive contact, the etching of the dielectric layer performed with a first etch chemistry and exposing portions of the etch stop layer;
   etching the exposed portions of the etch stop layer with a second etch chemistry that is different than the first etch chemistry, and exposing portions of the aluminum oxide sidewall barrier; and
   etching the exposed portions of the aluminum oxide sidewall barrier layer with the first etch chemistry, thereby exposing a top portion of the ferroelectric capacitor stack and the second conductive contact.

14. The method of claim 13, wherein the etching of the dielectric layer, the etch stop layer, and the aluminum oxide sidewall barrier layer are performed in the same process chamber.

15. The method of claim 13, wherein the first etch chemistry is substantially selective with respect to the etch stop layer, thereby causing the etching to substantially stop after reaching the etch stop layer in the first and second contact vias, respectively.

16. The method of claim 13, wherein the first etch chemistry comprises a fluorocarbon-oxygen etch chemistry.

17. The method of claim 13, wherein the second etch chemistry comprises $CH_2F_2$ and $O_2$ in combination with an inert gas comprising He, Ne, Ar, Kr, Xe or $N_2$ or mixtures thereof.

18. The method of claim 15, wherein the second etch chemistry is substantially selective with respect to the dielectric layer containing silicon oxide, thereby causing the etching of the etch stop layer in the first and second contact vias without a substantial degradation of the dielectric layer.

19. The method of claim 16, wherein the first etch chemistry comprises $C_5F_8$ and $O_2$ or $C_4F_8$ and $O_2$ in combination with an inert gas comprising He, Ne, Ar, Kr, Xe or $N_2$ or mixtures thereof.

20. The method of claim 17, wherein the second etch chemistry has flow ratios of $CH_2F_2$ and $O_2$ that are within about 25% of one another, and wherein a gas flow of the inert gas or inert gas mixture is about 4 times greater than the flow rate of the $CH_2F_2$ or $O_2$.

21. The method of claim 18, wherein the first etch chemistry comprises $C_5F_8$ and $O_2$ or $C_4F_8$ and $O_2$ in combination with an inert gas comprising He, Ne, Ar, Kr, Xe or $N_2$, or mixtures thereof, and wherein flow ratios of the $C_4F_8$ or $C_5F_8$ and $O_2$ gases are within approximately 25% of one another, and wherein an inert gas flow is at least a factor of 10 higher than the fluorocarbon or oxygen flow rate.

* * * * *